(12) United States Patent  
Furukawa et al.

(10) Patent No.: US 7,109,546 B2  
(45) Date of Patent: Sep. 19, 2006

(54) HORIZONTAL MEMORY GAIN CELLS

(75) Inventors: Toshiharu Furukawa, Essex Junction, VT (US); Mark Charles Hakey, Fairfax, VT (US); David Vaclav Horak, Essex Junction, VT (US); Charles William Koburger, III, Delmar, NY (US); Mark Eliot Masters, Essex Junction, VT (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 10/879,815

(22) Filed: Jun. 29, 2004

(65) Prior Publication Data

US 2005/0286293 A1 Dec. 29, 2005

(51) Int. Cl.  
*H01L 31/119* (2006.01)

(52) U.S. Cl. .................. 257/306; 257/311; 977/742

(58) Field of Classification Search ............. 257/306, 257/311; 977/742  
See application file for complete search history.

(56) References Cited

U.S. PATENT DOCUMENTS

| | | | |
|---|---|---|---|
| 5,796,573 A | 8/1998 | Kotecki et al. | 361/321.5 |
| 6,250,984 B1 | 6/2001 | Jin et al. | 445/51 |
| 6,423,583 B1 | 7/2002 | Avouris et al. | 438/132 |
| 6,515,325 B1 | 2/2003 | Farnworth et al. | 257/296 |
| 6,858,891 B1 | 2/2005 | Farnworth et al. | 257/296 |
| 6,891,227 B1 | 5/2005 | Appenzeller et al. | 257/346 |
| 2002/0001905 A1 | 1/2002 | Choi et al. | |
| 2002/0163079 A1 | 11/2002 | Awano | |
| 2003/0132461 A1 | 7/2003 | Roesner et al. | |
| 2003/0168683 A1 | 9/2003 | Farnworth et al. | |
| 2003/0170930 A1 | 9/2003 | Choi et al. | |
| 2003/0178617 A1 | 9/2003 | Appenzeller et al. | |
| 2003/0227015 A1 | 12/2003 | Choi et al. | |
| 2003/0230760 A1 | 12/2003 | Choi et al. | |
| 2005/0056825 A1* | 3/2005 | Bertin et al. | 257/20 |
| 2005/0056877 A1* | 3/2005 | Rueckes et al. | 257/300 |

(Continued)

FOREIGN PATENT DOCUMENTS

EP 1 331 671 A1 7/2003

(Continued)

OTHER PUBLICATIONS

G.S. Duesberg et al., Ways Towards the Scaleable Integration of Carbon Nanotubes into Silicon Based Technology, Diamond and Related Materials; Elsevier Science Publishers; Amsterdam, NL; vol. 13, No. 2; Feb. 1, 2004; pp. 354-361; XP004492567.

(Continued)

*Primary Examiner*—Sara Crane  
(74) *Attorney, Agent, or Firm*—Wood, Herron & Evans, LLP

(57) ABSTRACT

A gain cell for a memory circuit, a memory circuit formed from multiple gain cells, and methods of fabricating such gain cells and memory circuits. The memory gain cell includes a storage capacitor, a write device electrically coupled with the storage capacitor for charging and discharging the storage capacitor to define a stored electrical charge, and a read device. The read device includes one or more semiconducting carbon nanotubes each electrically coupled between a source and drain. A portion of each semiconducting carbon nanotube is gated by the read gate and the storage capacitor to thereby regulate a current flowing through each semiconducting carbon nanotube from the source to the drain. The current is proportional to the electrical charge stored by the storage capacitor. In certain embodiments, the memory gain cell may include multiple storage capacitors.

42 Claims, 15 Drawing Sheets

U.S. PATENT DOCUMENTS

| | | |
|---|---|---|
| 2005/0129948 A1 | 6/2005 | Furukawa et al. |
| 2005/0130341 A1 | 6/2005 | Furukawa et al. |
| 2005/0167655 A1 | 8/2005 | Furukawa et al. |
| 2005/0167740 A1 | 8/2005 | Furukawa et al. |
| 2005/0167755 A1 | 8/2005 | Dubin et al. |
| 2005/0179029 A1 | 8/2005 | Furukawa et al. |

FOREIGN PATENT DOCUMENTS

| | | |
|---|---|---|
| EP | 1 361 608 | 11/2003 |
| EP | 1 435 660 A2 | 7/2004 |
| EP | 1420414 | 4/2005 |
| WO | 03/0363208 A2 | 7/2003 |
| WO | WO 2004/040616 | 3/2004 |
| WO | WO 2004/040668 | 3/2004 |
| WO | WO 2004/105140 | 12/2004 |

OTHER PUBLICATIONS

Z.F.Ren, "Large Arrays of Well-Aligned Carbon Nanotubes", *Proceedings of the 13th International Winter School on Electronic Properties of Novel Materials*, p. 263-267, Feb. 27-Mar. 6, 1999, Kirchberg / Tirol, Austria.

Y.Zhao, et al, "Film growth of pillars of multi-walled carbon nanotubes", *J.PHys.: Condens. Matter 15* (2003) L565-L569.

Zhang, et al., "Electric-field-directed growth of aligned single-walled carbon nanotubes", *Applied Physics Letters*, vol. 79, No. 19, Nov. 5, 2001.

http://neep.nasa.gov/index_nasa.cfm/769/#synthesis, "Synthesis of CNT's".

C-H. Kiang, "Growth of Larger-Diameter Single-Walled Carbon Nanotubes," *J.Phys. Chem. A 2000*, 104, 2454-2456.

E.Ploenjes, et al, "Single-Walled Carbon Nanotube Synthesis in CO Laser Pumped Monoxide Plasma". Oct. 10, 2001.

Y.Mo, et al, "The growth mechanism of carbon nanotubes from thermal cracking of acetylene over nickel catalyst supported on alumina," *2001 Elsevier Science B.V.*

M.Jung, et al, "Growth of carbon nanotubes by chemical vapor deposition," *2001 Elsevier Science B.V.*

H.W.Zhu, et al, "Direct Synthesis of Long Single-Walled Carbon Nanotube Strands," May 3, 2002, vol. 296, *Science*.

H.Cui, et al, "Growth behavior of carbon nanotubes on multilayered metal catalyst film on chemical vapor deposition." *Chemical Physicsl Letters 374* (2003) 222-228.

J.Li, et al, "Highly-ordered carbon nanotube arrays for electronic applications". *Applied Physics Letters*, vol. 75, No. 3, Jul. 19, 1999.

Phillip G. Collins, et al., "Engineering Carbon Nanotubes and Nanotube Circuits Using Electrical Breakdown," *Science*, vol. 292, pp. 706-709, Apr. 27, 2001.

V. Derycke, et al., "Carbon Nanotube Inter- and Intra molecular Logic Gates," *Nano Letters*, xxxx vol. 0, No. 0 A-D (Received Aug. 16, 2001).

Phillip G. Collins, et al., "Nanotubes for Electronics," *Scientific American*, pp. 62-69, Dec. 2000.

S.J. Wind et al., "Vertical Scaling of Carbon Nanotube Field-Effect Transistors Using Top Gate Electrodes," *Applied Physics Letters*, vol. 80, No. 20, May 20, 2002, pp. 3817-3819.

Z.F.Ren, "Growth, Characterization, and Potential Applications of Periodic Carbon Nanotube Arrays", *Dept of Physics*, Boston College . . . Updated, 2001.

Jun Li, et al, "Bottom-up approach for carbon nanotube interconnects", NASA Ames Research Center, Moffett Field, CA, Rec'd Dec. 5, 2002, accepted Jan. 31, 2003.

Anyuan Cao, et al, "Grapevine-like growth of single walled carbon nanotubes among vertically aligned multiwalled nanotube Arrays", *Applied Physics Letters*, vol. 79, No. 9, Aug. 27, 2001.

Battelle No. 12132, "Carbon Nanotube Arrays: Synthesis of Dense Arrays of Well-Aligned Carbon Nanotubes Completely Filled with Titanium Carbide on Titanium Carbide on Titanium Substrates".

Aileen Chang, et al, "Integration of Nanotubes into Devices", *National Nanofabrication Users Network*, p. 58, Stanford Nanofabrication Facility.

Z.Huang,..Z.F.Ren., "Growth of highly oriented carbon nanotubes by plasma-enhanced hot filament chemical vapor deposition." *Applied Physics Letters*, vol. 73, No. 26, Dec. 28, 1998.

G.S. Duesberg et al., *Large-Scale Integration of Carbon Nanotubes Into Silicon Based Microelectronics*, Proceedings of the SPIE, Bellingham, VA, vol. 5118, May 21, 2003.

Z.F.Ren, et al, "Synthesis of Large Arrays of Well-Aligned Carbon Nanotubes on Glass", *Science*, vol. 282, Nov. 6, 1998, 1105-1107.

Won Bong Chol, et al, "Ultrahigh density nanotransistors by using selectively gr own vertical carbon nanotubes", *Applied Physics Letters*, vol. 79, No. 22, Nov. 26, 2001.

Bo Zheng, et al, "Efficient CVD Growth of Single-Walled Carbon Nanotubes on Surfaces Using Carbon Monoxide Precursor", *Nano Letters*, xxxx vol. 0, No. 0 A-D. *American Chemical Society* revised Jun. 26, 2002.

Gorman, "Nanoscale Networks: Superlong nanotubes can form a grid". *Science News Online*, May 3, 2003; vol. 163, No. 18.

"Tiny nanotubes set new record", Aug. 7, 2003. Nanotechweb.org.

"IBM Scientists Develop Carbon Nanotube Transistor Technology," IBM.com *News—news report concerning work published in Science*, vol. 292, Issue 5517, Apr. 27, 2001 entitled "Engineering Carbon Nanotubes and Nanotube Circuits Using Electrical Breakdown.".

Ploenjes et al., *Synthesis of single-walled carbon nanotubes in vibrationally non-equilibrium carbon monoxide*, Chemical Physics Letters 352 (2002) pp. 342-247.

V.N. Popov, *Carbon Nanotubes: Properties and Application*, Materials Science and Engineering, R. vol. R43, No. 3, pp. 61-102 (Jan. 15, 2004) (Summary only).

P.Harris, "Carbon Nanotubes and related structures", *Cambridge University Press* 1999.

K.Teo, et al, "Catalytic Synthesis of Carbon Nanotubes and Nanofibers", *Encyclopedia of Nanoscience and Nanotechnology*, vol. X, pp. 1-22, copyright 2003.

\* cited by examiner

HORIZONTAL MEMORY GAIN CELLS

FIELD OF THE INVENTION

The invention relates generally to semiconductor structures and devices and to a method for their fabrication and, more particularly, to memory gain cells and memory circuits and methods for fabricating such memory gain cells and memory circuits.

BACKGROUND OF THE INVENTION

Random access memory (RAM) devices permit execution of both read and write operations on its memory cells to manipulate and access stored binary data or binary operating states. Exemplary RAM devices include dynamic random access memory (DRAM) and static random access memory (SRAM). Typically, a high binary operating state (i.e., high logic level) is approximately equal to the power supply voltage and a low binary operating state (i.e., a low logic level) is approximately equal to a reference voltage, usually ground potential. SRAM memory cells are designed to hold a stored binary operating state until the held value is overwritten by a new value or until power is lost. In contrast, DRAM memory cells lose a stored binary operating state unless periodically refreshed every few milliseconds by sensing the held value and writing that held value back to the DRAM cell thereby restoring the DRAM memory cell to its original state. Memory circuits composed of DRAM memory cells are favored in many applications, despite this limitation, over memory circuits based upon SRAM memory cells because of the significantly greater attainable cell densities and low power required.

The area required for each SRAM memory cell contributes to determining the data storage capacity of an SRAM memory circuit. This area is a function of the number of elements constituting each memory cell and the feature size of each element. Conventional SRAM memory cells consist of four to six transistors having four cross-coupled transistors or two transistors and two resistors, as well as two cell-access transistors. A DRAM memory cell may be fabricated with a single capacitor for holding a charge and a single transistor for accessing the held value stored as charge in the capacitor, in contrast to the numerous transistors required for each SRAM memory cell. Absolute SRAM cell size can be improved with reductions in feature size arising from advances in lithography technology. However, further reductions in SRAM cell size may require more radical changes to the basic cell configuration. Despite their advantages over DRAM cells, conventional SRAM cells are expensive to produce and consume large areas on the substrate surface, which limits cell density.

The operation of a gain cell contrasts with the operation of both SRAM cells and DRAM cells. In a conventional gain cell, charge held by a storage capacitor operates as a gate that regulates current sensed over sense source and sense drain lines by remote access circuitry. Similar to a DRAM cell, the held values of a gain cell must be periodically refreshed. Although gain cells are less compact than DRAM cells, gain cells operate faster than DRAM cells. Although gain cells operate slower than SRAM cells, gain cells are more compact than SRAM cells. Therefore, gain cells are suitable candidates for applications such as on-chip cache memories.

What is needed, therefore, is a memory circuit in which each gain cell consumes less area per cell than conventional SRAM cells, incorporates a storage capacitor as a storage device, and features simplified access requirements.

SUMMARY OF THE INVENTION

In accordance with the principles of the invention, a memory gain cell includes a storage capacitor, a write device electrically coupled with the storage capacitor for charging and discharging the storage capacitor to define a stored electrical charge, and a read device. The read device includes a source, a drain, a read gate overlying the storage capacitor, and at least one semiconducting carbon nanotube with first and second ends electrically coupled with the source and drain, respectively. A portion of each semiconducting carbon nanotube between the first end and the second end is gated by the read gate and the storage capacitor to thereby regulate a current flowing through each semiconducting carbon nanotube from the source to the drain. The magnitude of the current is contingent upon the electrical charge stored by the storage capacitor. In certain alternative embodiments of the invention, the memory gain cell may include additional storage capacitors. A memory circuit may be constructed from an interconnected array of the memory gain cells.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1A:
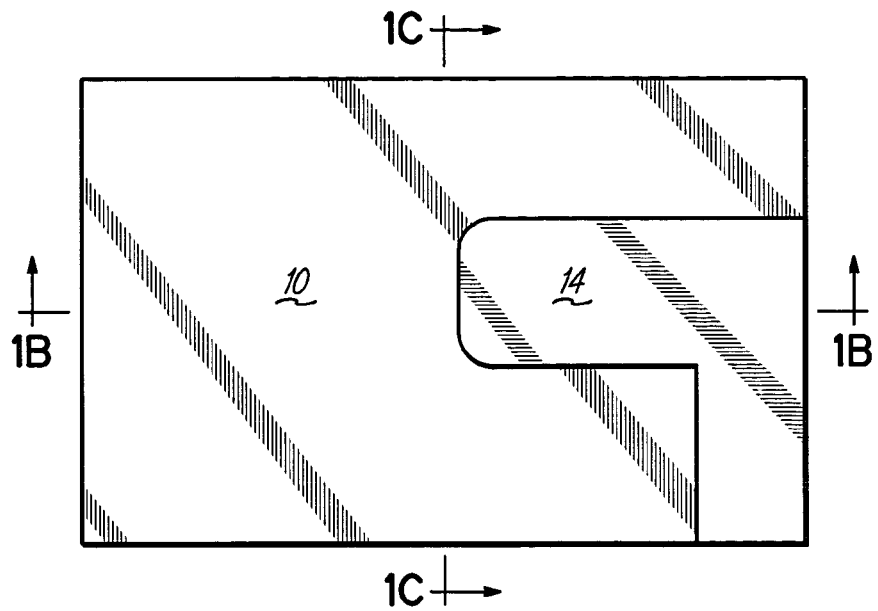
FIG. 1A is a diagrammatic top view of a portion of a substrate.
Figure 1B:
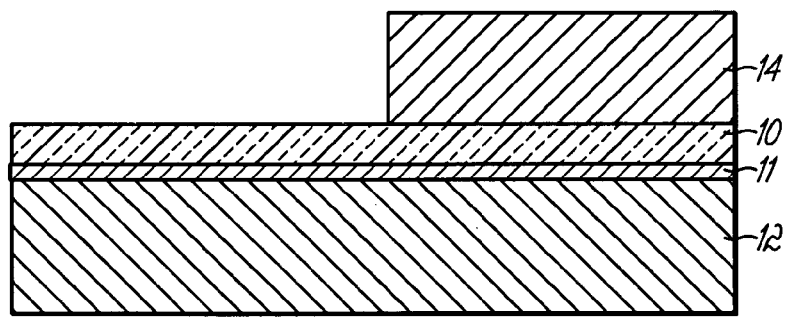
FIG. 1B is a cross-sectional view taken generally along lines 1B—1B of FIG. 1A.
Figure 1C:
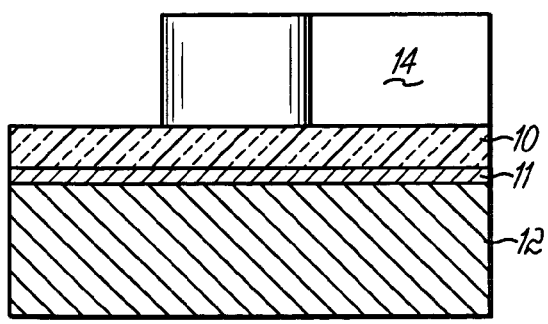
FIG. 1C is a cross-sectional view taken generally along lines 1C—1C of FIG. 1A.

With reference to FIGS. 1A, 1B and 1C, a pad structure 10 is formed on a substrate 12 of a semiconductor material. Substrate 12 is preferably a single crystal silicon wafer containing a relatively light concentration of a dopant, rendering it either n-type or p-type. Typically, the pad structure 10 is an insulator that includes a layer of nitride ($Si_3N_4$) separated from the substrate 12 by a thin oxide 11, such as silicon dioxide ($SiO_2$) layer grown by exposing substrate 12 to either a dry oxygen ambient or steam in a heated environment. A patterned layer of resist 14 is formed on the pad structure 10 for defining isolated substrate regions, as explained below.

References herein to terms such as "vertical", "horizontal", etc. are made by way of example, and not by way of limitation, to establish a frame of reference. The term "horizontal" as used herein is defined as a plane parallel to the conventional plane or surface of substrate 12, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood various other frames of reference may be employed without departing from the spirit and scope of the invention.

Figure 2A:
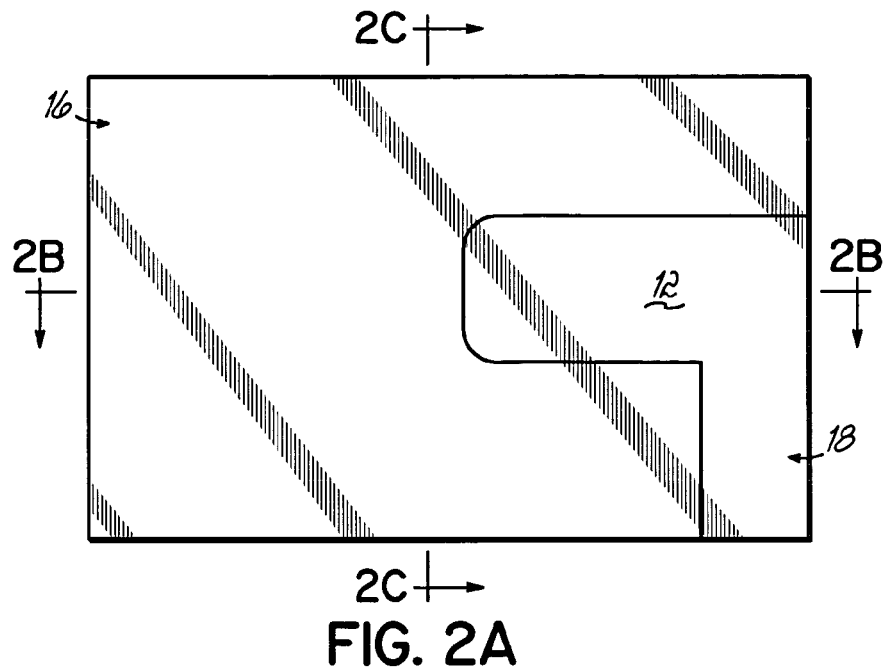
FIGS. 2A, 2B and 2C are views similar to FIGS. 1A, 1B and 1C, respectively, at a subsequent fabrication stage.
Figure 2B:
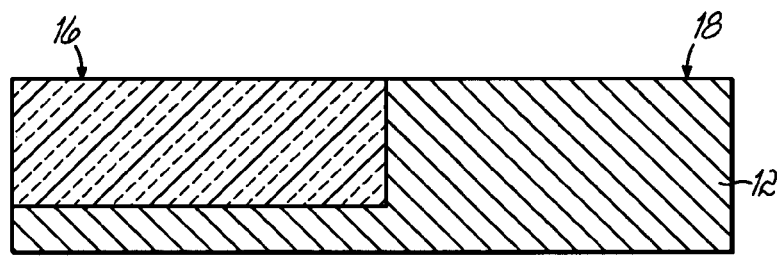
Figure 2C:
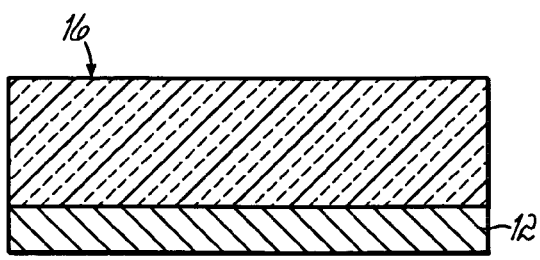

With reference to FIGS. 2A, 2B and 2C in which like features refer to like reference numerals in FIGS. 1A, 1B and 1C and at a subsequent fabrication stage, the pad structure 10 and substrate 12 are patterned using the patterned layer of resist 14 as a lithographic template by a standard etch process to define trenches in the substrate 12. Isolation regions 16 are formed, after the resist 14 is stripped, by completely filling the trenches with a conformal layer of an appropriate dielectric material, such as silicon dioxide deposited conformally by chemical vapor deposition (CVD). The dielectric material overlying active regions 18 is removed and the composite surface defined by isolation regions 16 and active regions 18 is polished flat and planarized by a chemical-mechanical polishing (CMP) process or any other suitable planarization technique. The patterned pad structure 10 acts as a polish stop for the planarization operation and is removed from the substrate 12 after the planarization operation that results in a coplanar surface between the isolation regions 16 and active regions 18 of substrate 12. Isolation regions 16 define the dimensions and placement of active regions 18 in the substrate 12 in and on which semiconductor devices may be constructed.

Figure 3A:
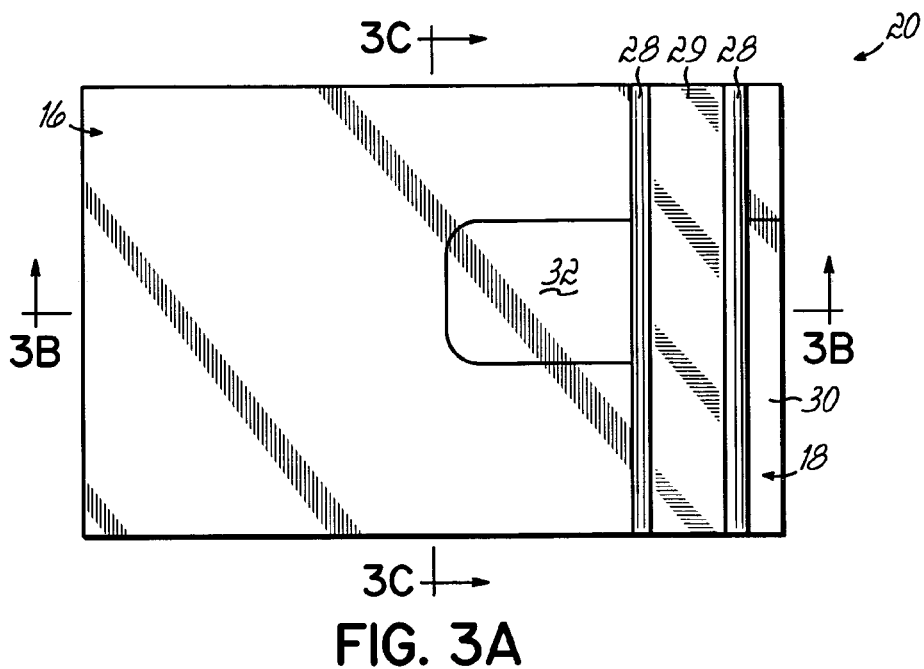
FIGS. 3A, 3B and 3C are views similar to FIGS. 2A, 2B and 2C, respectively, at a subsequent fabrication stage.
Figure 3B:
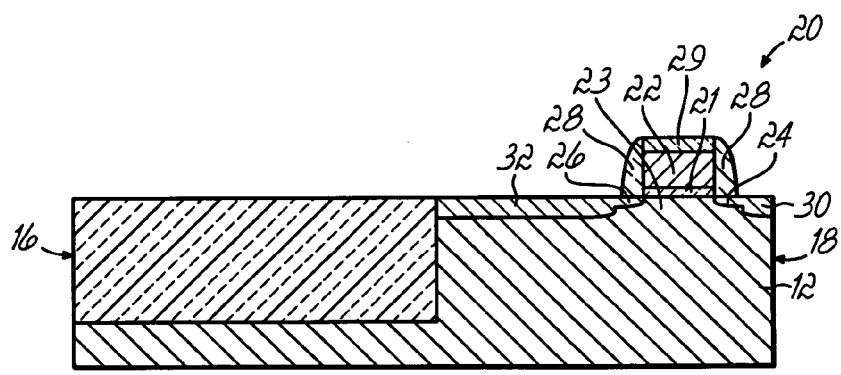
Figure 3C:
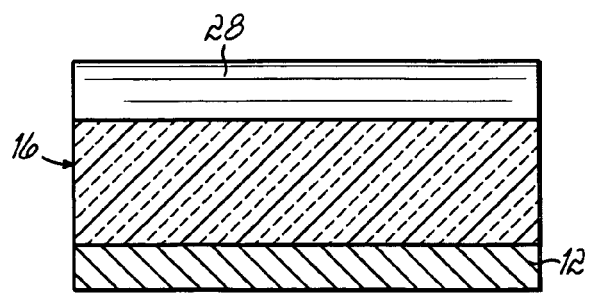

With reference to FIGS. 3A, 3B and 3C in which like features refer to like reference numerals in FIGS. 2A, 2B and 2C and at a subsequent fabrication stage, a semiconductor write device 20, which is illustrated as a metal-oxide-semiconductor field effect transistor (MOSFET), is formed. A patterned gate dielectric 21 is formed on the active regions 18. Gate dielectric 21 preferably comprises an oxide (i.e., $SiO_2$) grown from either a dry oxygen ambient or steam. The thickness of gate dielectric 21 is contingent upon the required performance of the write device 20.

A gate electrode 22 of the write device 20 is then formed by depositing a layer of an electrically conductive material over the gate dielectric, depositing a layer of insulating material on the conductive material, and removing selected regions by a standard lithography and etch process. After patterning, a self-aligned cap 29 of the insulating material overlies the gate electrode 22, which is composed of the conductive material. The gate electrode 22 of each active region 18 has an overlying relationship with the corresponding gate dielectric 21. The conductive material of electrode 22 may be polycrystalline silicon ("polysilicon") rendered highly conductive by the presence of a suitable dopant. In alternative embodiments, the gate electrode 22 may be formed from one or more metals, such as molybdenum, titanium, tantalum or nickel, a metal silicide, or a metal nitride, and the gate dielectric 21 may be formed from any of the numerous candidate high dielectric constant (high-k) materials, including but not limited to $Si_3N_4$, oxynitride $SiO_xN_y$, a gate dielectric stack of $SiO_2$ and $Si_3N_4$, and metal oxides like $Ta_2O_5$, as recognized by persons of ordinary skill in the art.

A source extension 24 and a drain extension 26 are formed on opposite sides of gate electrode 22 by, for example, using a technique familiar to persons of ordinary skill in the art. Briefly, a dopant species suitable for either p-type extension regions or n-type extensions 24, 26 may be implanted into substrate 12 using the gate electrode 22 as a self-aligned ion implantation mask and the substrate 12 is thermally annealed to activate the dopant. Sidewall spacers 28 are then formed on the gate electrode 22 from a material such as $Si_3N_4$, as is familiar to persons of ordinary skill in the art. The gate electrode 22 and sidewall spacers 28 act as a self-aligned mask for implanting a dopant species to form a deep-doped source region 30 and a deep-doped drain region 32. The technique of implanting dopant species to form source and drain regions 30, 32 is familiar to persons of ordinary skill in the art. Briefly, a dopant species suitable for either p-type or n-type source and drain regions 30, 32 is implanted into active region 18 of substrate 12 using gate electrode 22 and sidewall spacers 28 as a self-aligned ion implantation mask and the substrate 12 is subsequently thermally annealed to activate the dopant. A portion of substrate 12 defined between the source and drain regions 30, 32 comprises a channel 23 having a resistivity controlled by voltage supplied from a power supply to the gate electrode 22 and electrostatically coupled with the channel 23 through the gate dielectric 21.

The gate electrode 22 extends into and out of the plane of the page for coupling write devices 20 aligned in a column of the memory circuit. The length of the gate electrode 22 overlying the gate dielectric 21 operates as an individual gate electrode for the write device 20 of memory gain cell 64 (FIGS. 14A–C), which is among the many identical gain cells constituting the memory circuit. Other write lines, similar to and generally parallel with gate electrode 22, couple write devices 20 in other columns of the memory circuit.

Figure 4A:
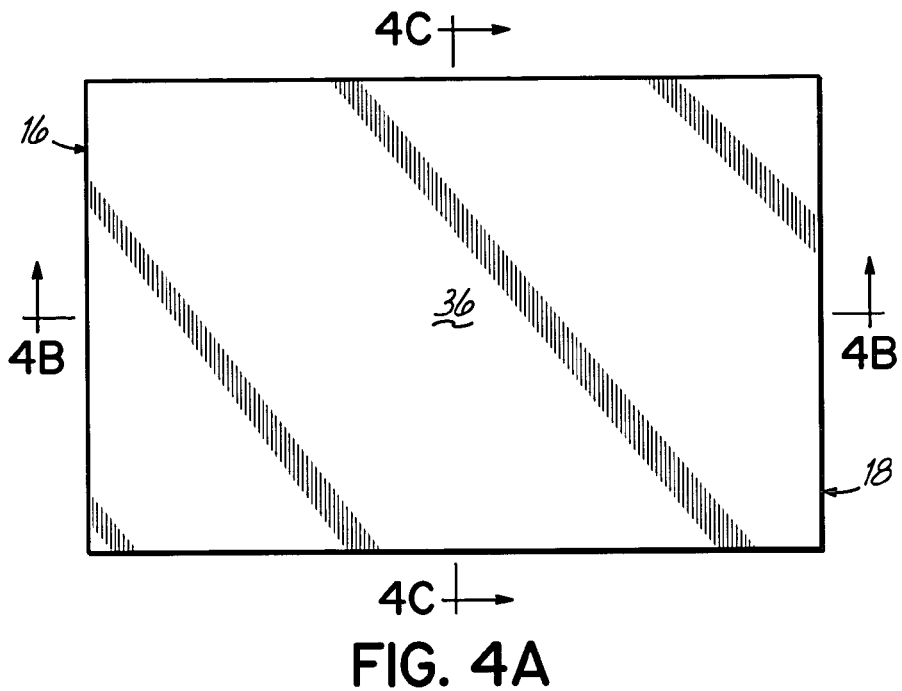
FIGS. 4A, 4B and 4C are views similar to FIGS. 3A, 3B and 3C, respectively, at a subsequent fabrication stage.
Figure 4B:
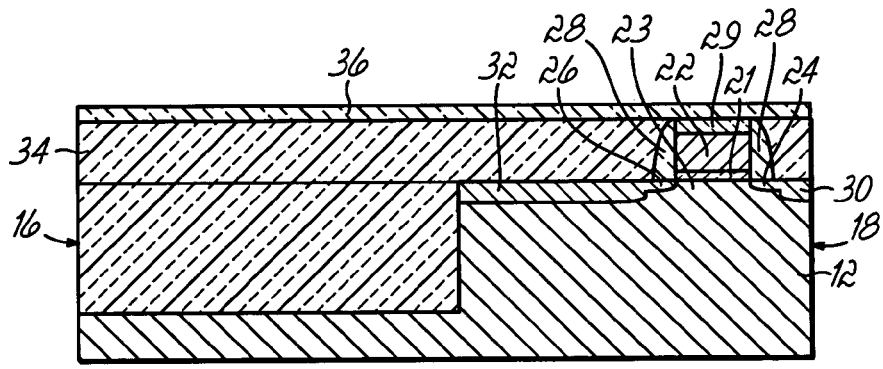
Figure 4C:
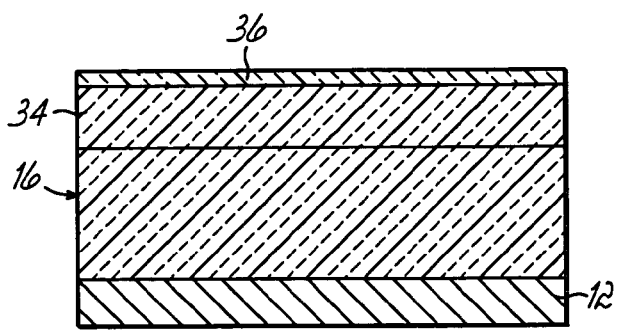

With reference to FIGS. 4A, 4B and 4C in which like features refer to like reference numerals in FIGS. 3A, 3B and 3C and at a subsequent fabrication stage, a layer 34 of an electrically-insulating material, such as $SiO_2$ or another dielectric, is deposited by, for example, CVD on the substrate 12 and then polished flat by a CMP process or any other suitable planarization technique using the cap 29 as a polish stop. A polish stop layer 36 of another insulating substance, such as $Si_3N_4$, is then deposited on layer 34.

Figure 5A:
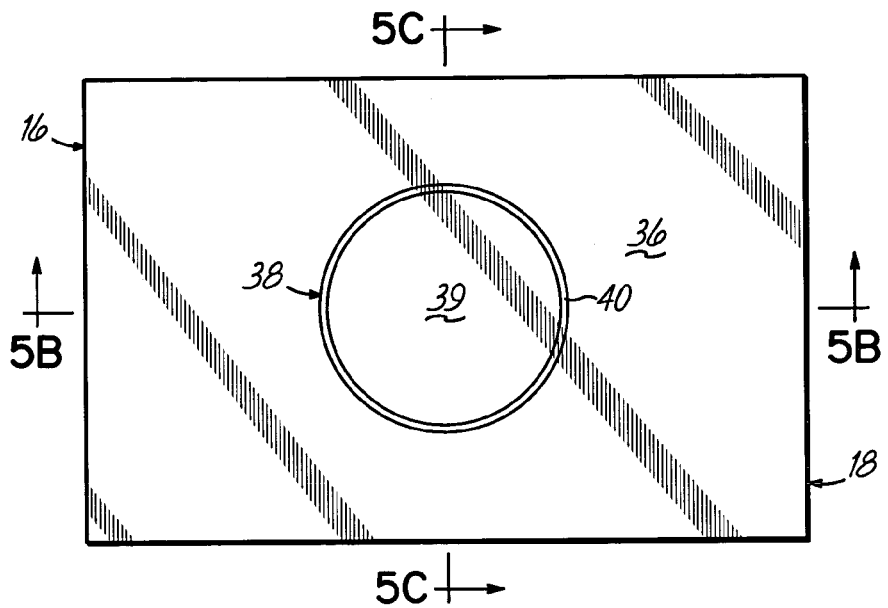
FIGS. 5A, 5B and 5C are views similar to FIGS. 4A, 4B and 4C, respectively, at a subsequent fabrication stage.
Figure 5B:
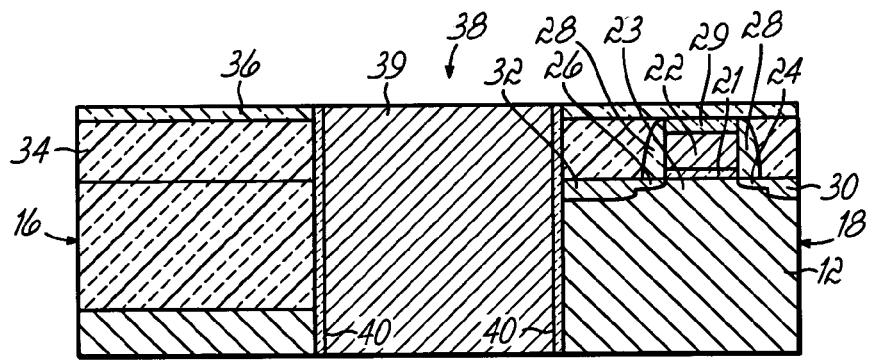
Figure 5C:
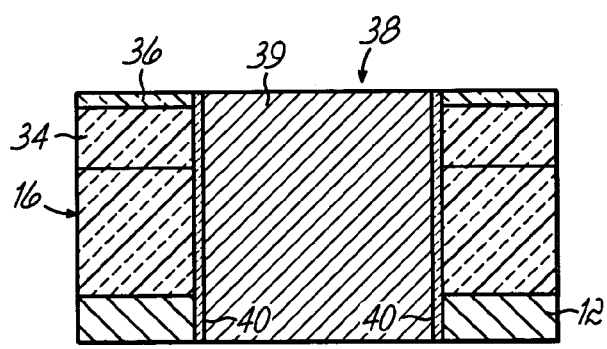

With reference to FIGS. 5A, 5B and 5C in which like features refer to like reference numerals in FIGS. 4A, 4B and 4C and at a subsequent fabrication stage, a standard lithography and anisotropic etch process are used to form an opening in layers 34 and 36, the dielectric material of isolation region 16, and the substrate 12 adjacent to the write device 20. The lithography step employed in forming the opening includes the steps of applying a resist on polish stop layer 36, exposing the resist to a pattern of radiation, and developing the pattern in the resist utilizing a conventional developer. The etching step employed comprises a conventional dry etching process, such as reactive-ion etching (RIE), capable of removing unmasked regions of layers 34 and 36, the dielectric material of isolation region 16, and penetrating a suitable depth into substrate 12. After the resist layer is stripped, a layer 40 of a suitable dielectric, such as thermal oxide or $Si_3N_4$, is formed on the bottom of the opening and on the sidewall of the opening over a vertical extent effective to isolate a conductive plug 39 from the substrate 12. The conductive plug 39 filling the opening originates from a conformal layer of a conductor, such as heavily-doped polysilicon, that is polished flat by a CMP process or any other suitable planarization technique stopping on the upper horizontal surface of polish stop layer 36.

Figure 6A:
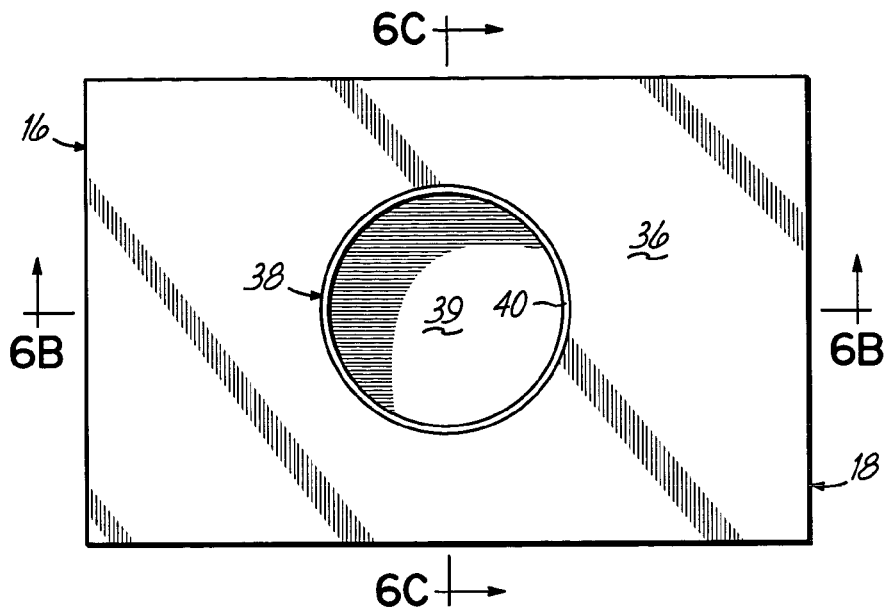
FIGS. 6A, 6B and 6C are views similar to FIGS. 5A, 5B and 5C, respectively, at a subsequent fabrication stage.
Figure 6B:
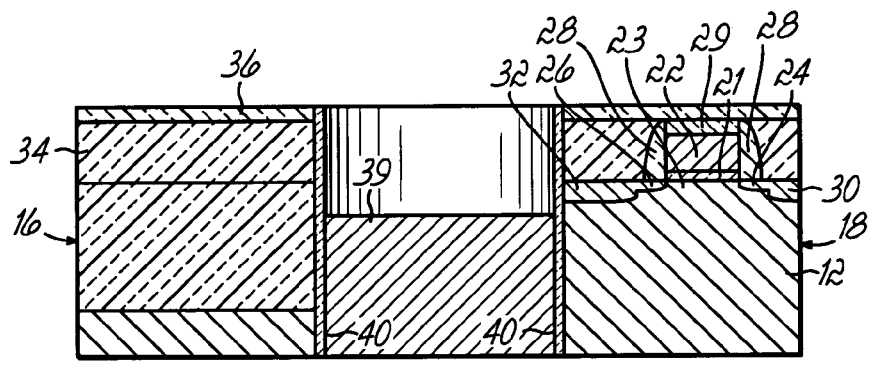
Figure 6C:
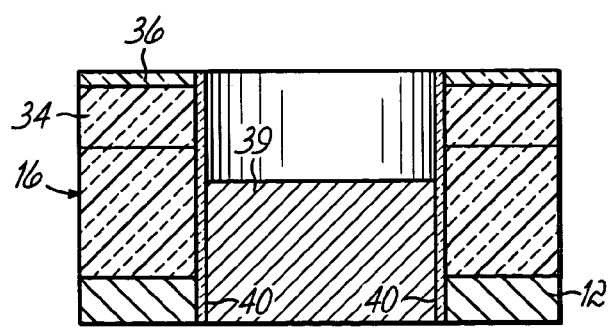

With reference to FIGS. 6A, 6B and 6C in which like features refer to like reference numerals in FIGS. 5A, 5B and 5C and at a subsequent fabrication stage, the conductive plug 39 is recessed by a timed anisotropic dry etch process to a depth vertically below the horizontal level of drain region 32 and vertically within the vertical boundaries of isolation region 16. The patterned layer 36 operates as a hard mask for the etch process recessing plug 39, which is also selective to the material forming vertical layer 40. The etch process must also be selective to the material forming isolation region 16 and to the material forming layer 34 if isolation region 16 and layer 34 not protected by layer 40.

Figure 7A:
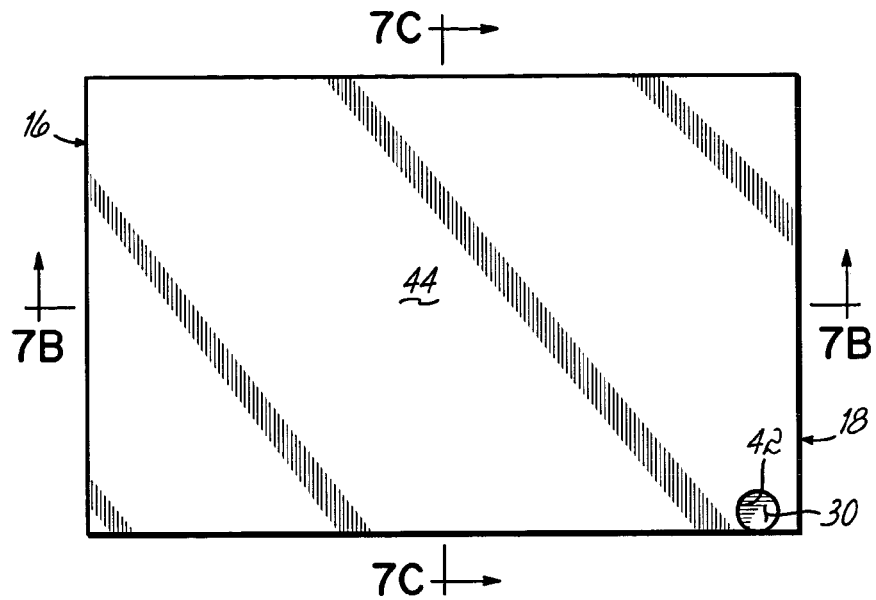
FIGS. 7A, 7B and 7C are views similar to FIGS. 6A, 6B and 6C, respectively, at a subsequent fabrication stage.
Figure 7B:
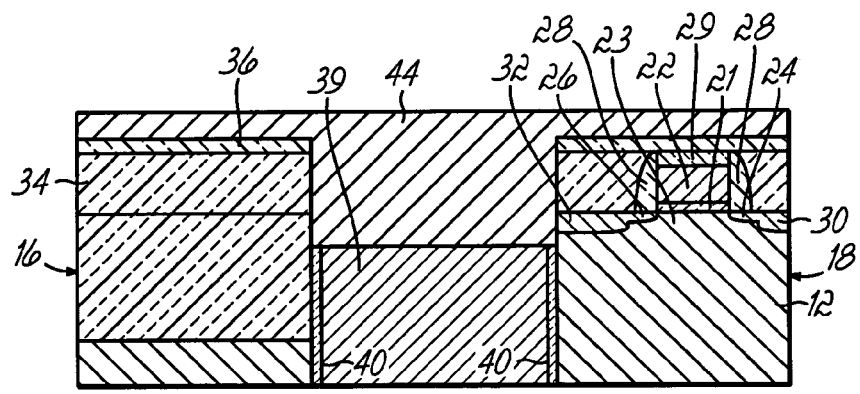
Figure 7C:
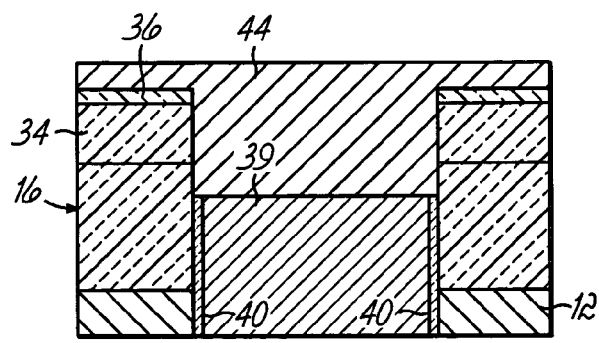

With reference to FIGS. 7A, 7B and 7C in which like features refer to like reference numerals in FIGS. 6A, 6B and 6C and at a subsequent fabrication stage, the vertical layer 40 is removed from the sidewall of the substrate 12 to the depth of the recessed level of the conductive plug 39. A contact opening 42 (FIG. 7A) is then opened to the source region 30 by a standard lithography and etch process. Briefly, a resist layer 44 is applied to substrate 12 and patterned by a conventional method to define masked and unmasked areas overlying layer 36 and then portions of layers 34 and 36 are removed in unmasked areas of the pattern by an anisotropic dry etch process.

Figure 8A:
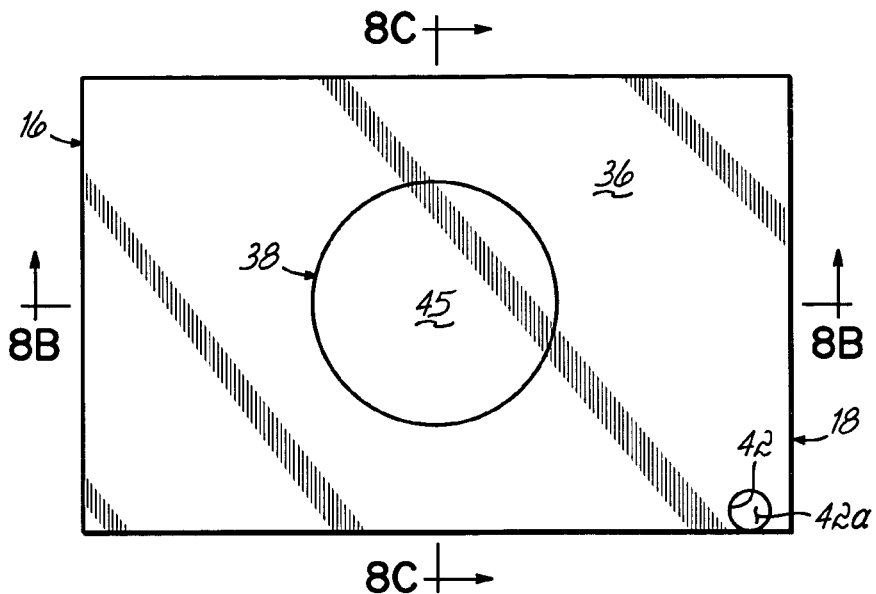
FIGS. 8A, 8B and 8C are views similar to FIGS. 7A, 7B and 7C, respectively, at a subsequent fabrication stage.
Figure 8B:
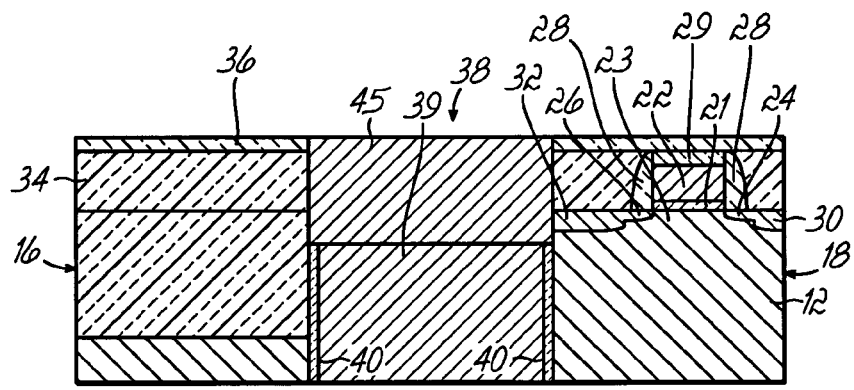
Figure 8C:
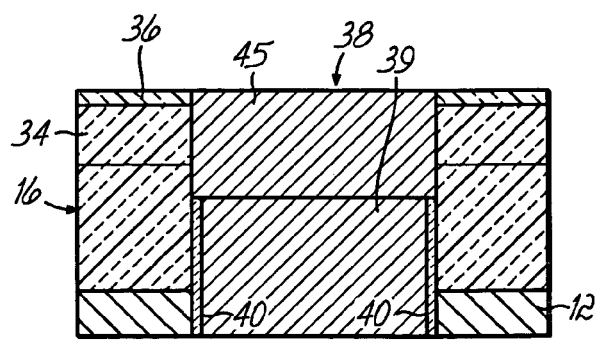

With reference to FIGS. 8A, 8B and 8C in which like features refer to like reference numerals in FIGS. 7A, 7B and 7C and at a subsequent fabrication stage, the patterned resist layer 44 is stripped. The recess above the conductive plug 39 is filled by another conductive plug 45 originating from a conformal layer of a conductor, such as heavily-doped polysilicon, that is applied to fill the recess and then polished flat by a CMP process or any other suitable planarization technique again relying on the upper surface of layer 36 as a polish stop. In this manner, contact is established between conductive plugs 39, 45 and the drain region 32 of the write device 20. The vertical layer 40 also electrically isolates the conductive plugs 39, 45 from substrate 12 to define a storage capacitor 38, which assumes the configuration of a deep-trench capacitor in the exemplary embodiment in which the conductive plugs 39, 45 form one side of storage capacitor 38, substrate 12 provides the other side of storage capacitor 38, and vertical layer 40 defines the capacitor dielectric. The process providing conductive plug 45 also forms a contact 42a in the contact opening 42 defining a contact to the source region 30. The substrate 12 is connected to a reference voltage, which may be a ground potential.

Figure 9A:
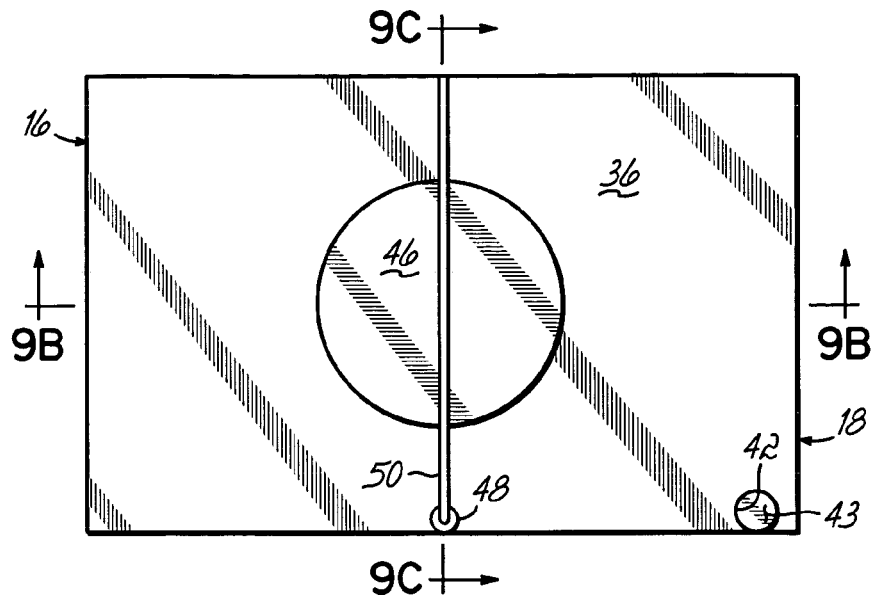
FIGS. 9A, 9B and 9C are views similar to FIGS. 8A, 8B and 8C, respectively, at a subsequent fabrication stage.
Figure 9B:
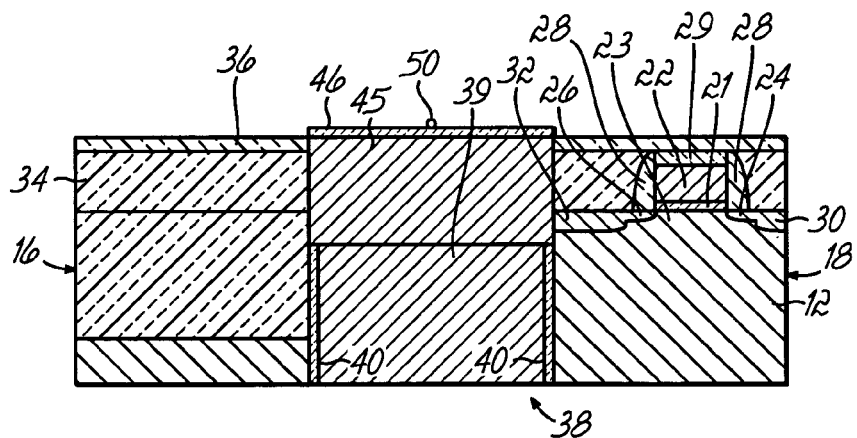
Figure 9C:
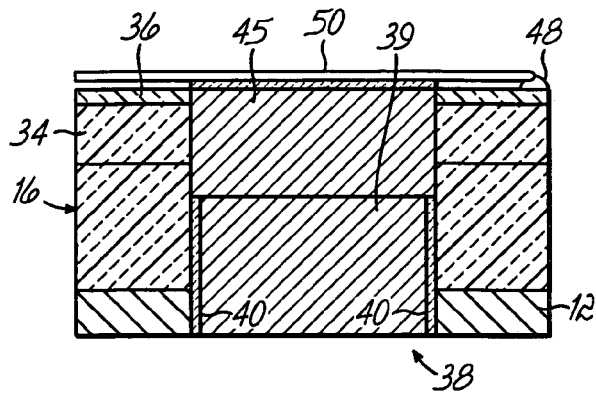

With reference to FIGS. 9A, 9B and 9C in which like features refer to like reference numerals in FIGS. 8A, 8B and 8C and at a subsequent fabrication stage, a gate dielectric layer 46 is formed over the conductive material filling storage capacitor 38. Layer 46 is formed of a thin film of a dielectric material, such as $SiO_2$, that does not catalyze synthesis of carbon nanotubes. If the conductive material filling storage capacitor 38 is polysilicon, layer 46 may be formed by a standard oxidation process. The process forming layer 46 also forms a temporary cap 43 over contact 42a that is removed before write bit line 58 (FIG. 12A–C) is formed.

Small seed pads 48 are formed at specific, preselected locations on layer 36 by a conventional lift-off process or by a standard lithography and etch process. The seed pads 48 are constituted by any catalytic material capable of nucleating and supporting the synthesis or growth of semiconducting carbon nanotubes when exposed to appropriate CVD reactants under chemical reaction conditions suitable to promote nanotube growth. The catalytic material may be, but is not limited to, iron, nickel, cobalt, compounds of these metals such as metal oxides, and alloys of these metals.

One or more semiconducting carbon nanotube(s) 50 are grown and extend horizontally from the seed pad 48 above the gate dielectric layer 46 and generally overlie the conductive plug 45 of storage capacitor 38. Carbon nanotube(s) 50 are synthesized by a CVD process or a plasma-enhanced CVD process that exposes the seed pads 48 to gaseous or vaporized carbonaceous reactant(s). Suitable reactant(s) include, but are not limited to, carbon monoxide (CO) and hydrogen ($H_2$), ethylene ($C_2H_4$), methane ($CH_4$), xylene ($C_6H_4(CH_3)_2$), acetylene ($C_2H_2$), a mixture of $C_2H_2$ and ammonia ($NH_3$), a mixture of $C_2H_2$ and nitrogen ($N_2$), a mixture of $C_2H_2$ and $H_2$, and a mixture of ethanol ($C_2H_6O$) and $N_2$. The reactant(s) are supplied under growth conditions suitable for promoting a chemical reaction that synthesizes semiconducting carbon nanotube(s) 50 on the catalytic material of seed pads 48. Nanotube synthesis is believed to occur by addition of carbon atoms from the reactant(s) at an interface between the carbon nanotube(s) 50 and seed pad 48. The catalytic material of seed pad 48 reduces the activation energy of the reaction forming carbon nanotube(s) 50 without itself being transformed or consumed by the chemical reaction. The nanotube conditions and reactant(s) and/or the types of catalyst material constituting seed pads 48 are chosen to selectively grow carbon nanotube(s) 50 characterized by semiconducting properties. Horizontal growth and lengthening of the carbon nanotube(s) 50 in the desired direction may be promoted by directing the reactant flow horizontally across the surface of seed pads 48 in a direction across the upper surface of the storage capacitor 38.

Figure 10A:
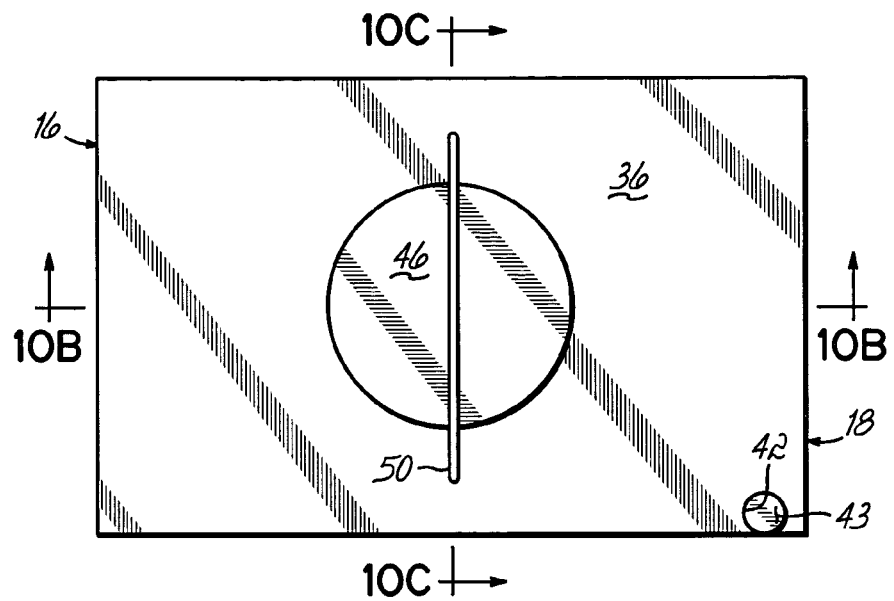
FIGS. 10A, 10B and 10C are views similar to FIGS. 9A, 9B and 9C, respectively, at a subsequent fabrication stage.
Figure 10B:
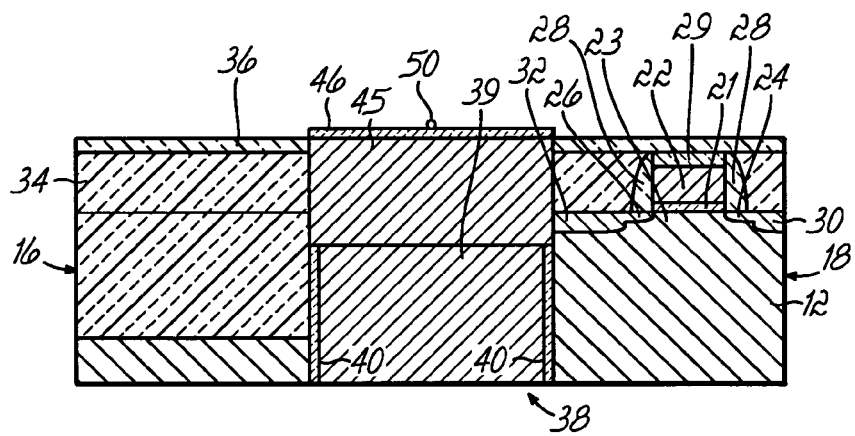
Figure 10C:
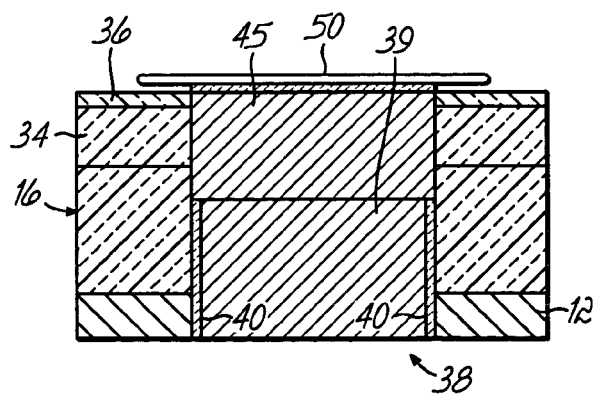

With reference to FIGS. 10A, 10B and 10C in which like features refer to like reference numerals in FIGS. 9A, 9B and 9C and at a subsequent fabrication stage, the carbon nanotube(s) 50 are trimmed or truncated by a standard lithography and etch process. Specifically, the end of each carbon nanotube(s) 50 formerly in contact with the seed pad 48 is shortened, as well as the opposite free end of each carbon nanotube(s) 50 if needed. Seed pad 48 is removed by a conventional etch process, such as a wet chemical etch using an appropriate aqueous etchant.

Figure 11A:
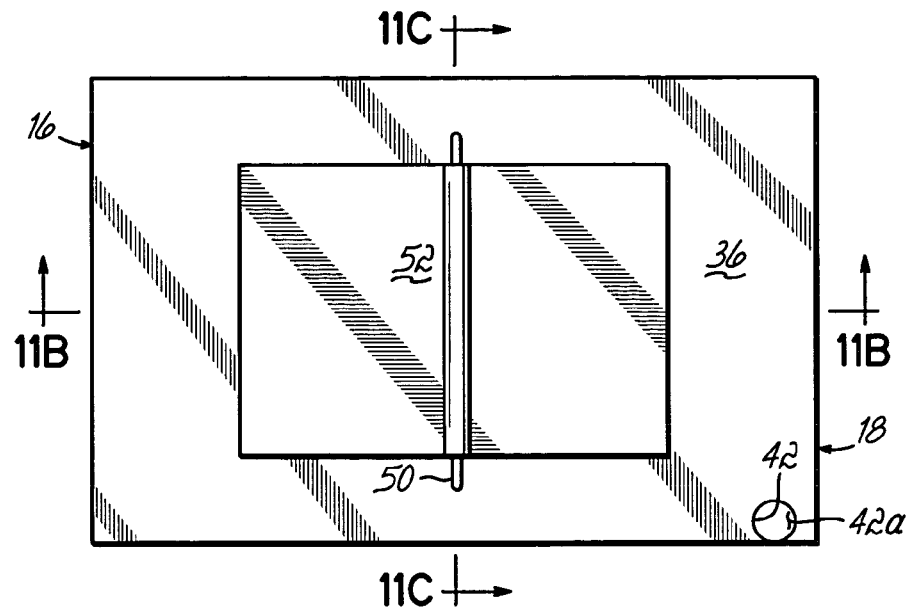
FIGS. 11A, 11B and 11C are views similar to FIGS. 10A, 10B and 10C, respectively, at a subsequent fabrication stage.
Figure 11B:
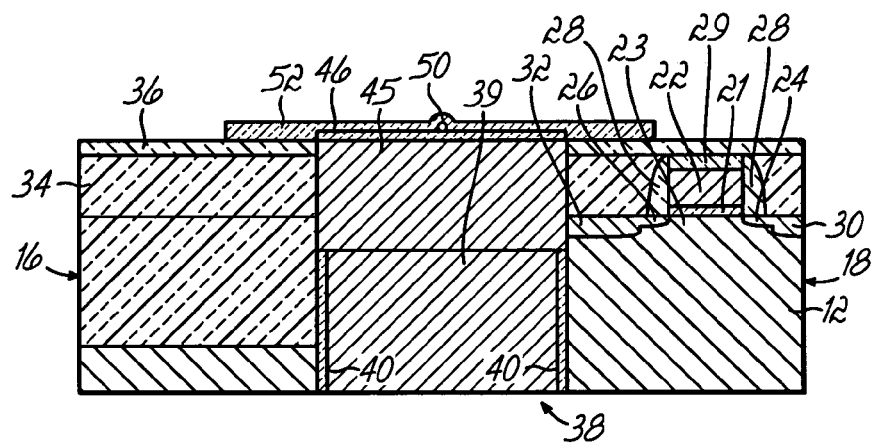
Figure 11C:
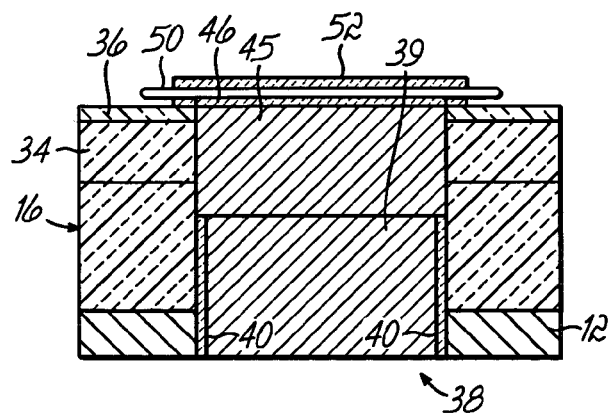

With reference to FIGS. 11A, 11B and 11C in which like features refer to like reference numerals in FIGS. 10A, 10B and 10C and at a subsequent fabrication stage, a gate dielectric 52 of an appropriate insulating material is formed at a location overlying the gate dielectric layer 46 and storage capacitor 38. In certain embodiments, gate dielectric 52 is formed by depositing a layer of $SiO_2$ by atomic layer deposition and patterning this layer by a standard lithography and etch process. Alternatively, the gate dielectric 52 may be formed of a patterned layer of any of the many candidate high dielectric constant (high-k) materials, including but not limited to $Si_3N_4$, $SiO_xN_y$, a gate dielectric stack of $SiO_2$ and $Si_3N_4$, and metal oxides like $Ta_2O_5$, as recognized by persons of ordinary skill in the art. The dielectric material of gate dielectric 52 conformally coats and encapsulates the length of carbon nanotube(s) 50 lying inside the outer perimeter of gate dielectric 46. Opposite free ends of the carbon nanotube(s) 50 are exposed following patterning of the dielectric material constituting gate dielectric 52.

Figure 12A:
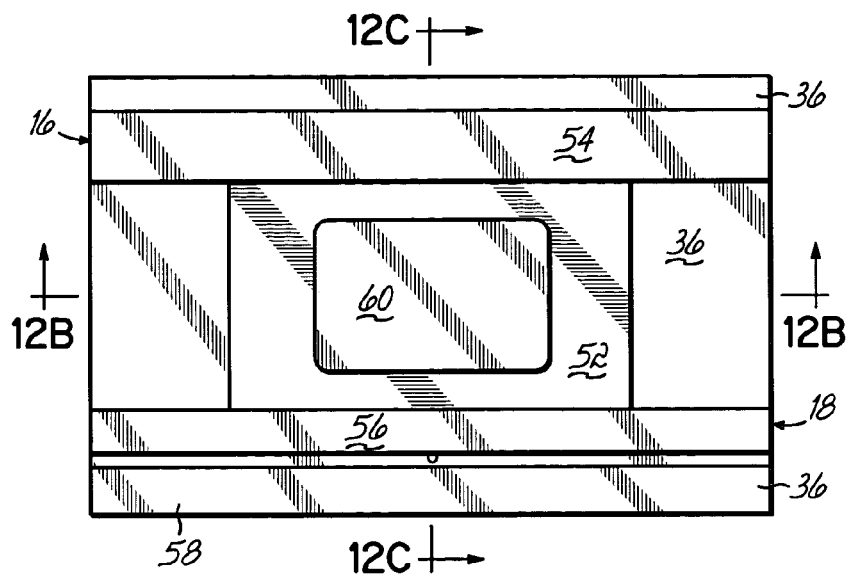
FIGS. 12A, 12B and 12C are views similar to FIGS. 11A, 11B and 11C, respectively, at a subsequent fabrication stage.
Figure 12B:
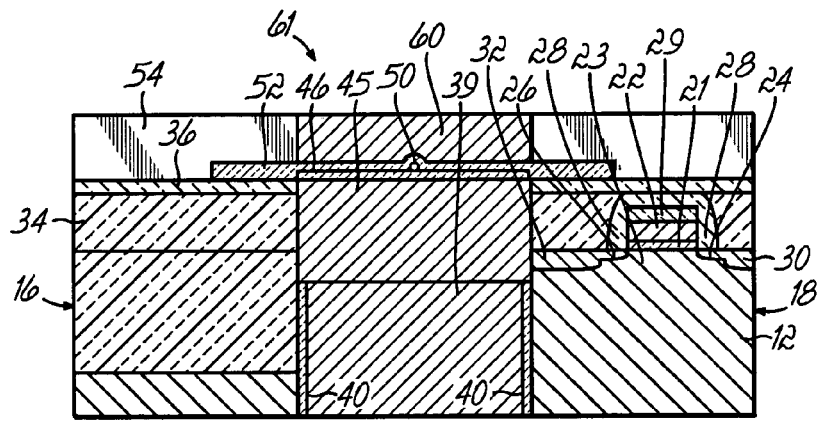
Figure 12C:
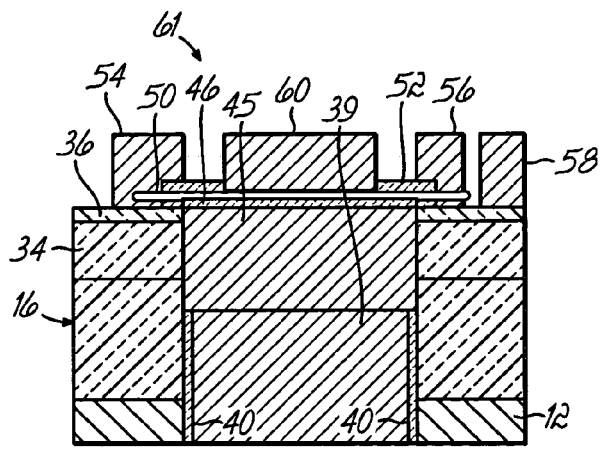

With reference to FIGS. 12A, 12B and 12C in which like features refer to like reference numerals in FIGS. 11A, 11B and 11C and at a subsequent fabrication stage, a sense drain 54, a sense source 56, a write bit line 58, and a read gate electrode 60 are formed by subjecting a layer of a conductor, such as heavily-doped polysilicon, to a standard lithography and etch process. The write bit line 58 is coupled electrically with the contact 42a to the source region 30 of write device 20 and the corresponding contacts 42a of similar write devices 20 of memory gain cells 64 fabricated in adjacent active regions 18. The sense drain 54 is electrically coupled with one free end of carbon nanotube(s) 50 and the sense source 56 is electrically coupled with the opposite free end of carbon nanotube(s) 50. The sense drain and source 54, 56 each extend across the surface of substrate 12 so as to be electrically coupled with the opposite ends of carbon nanotube(s) 50 of adjacent gain cells similar or identical to gain cell 64 and, hence, serve as common drain and source, respectively, for gain cells 64 in a row of the memory array. The read gate electrode 60 is formed on the gate dielectric 52, which electrically isolates the read gate electrode 60 from the storage capacitor 38. The carbon nanotube(s) 50 define a channel region coupled at opposite ends to the sense drain and source 54, 56, respectively. The channel region defined by carbon nanotube(s) 50 has a resistivity that is controlled by voltage supplied from a power supply to the read gate electrode 60 and electrostatically coupled to the channel region through the gate dielectric 52. This combination of elements defines a read device, generally indicated by reference numeral 61.

Figure 13A:
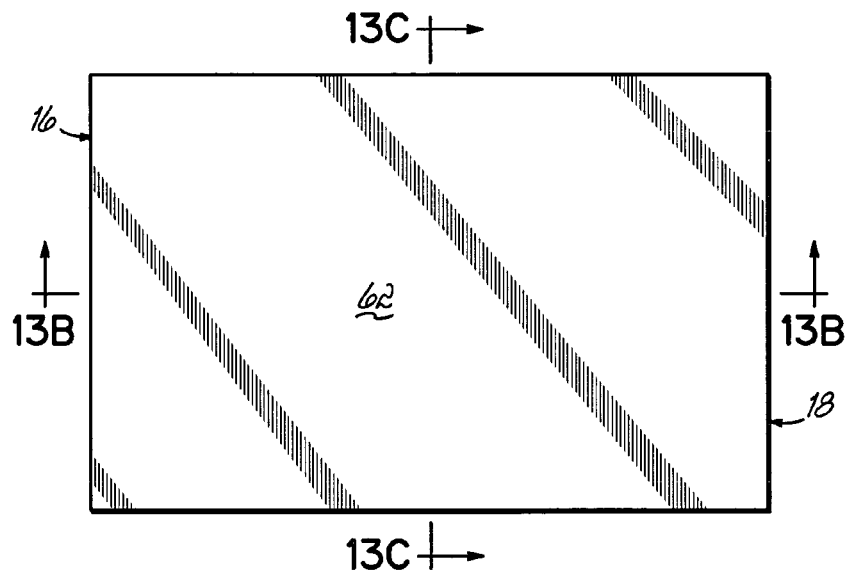
FIGS. 13A, 13B and 13C are views similar to FIGS. 12A, 12B and 12C, respectively, at a subsequent fabrication stage.
Figure 13B:
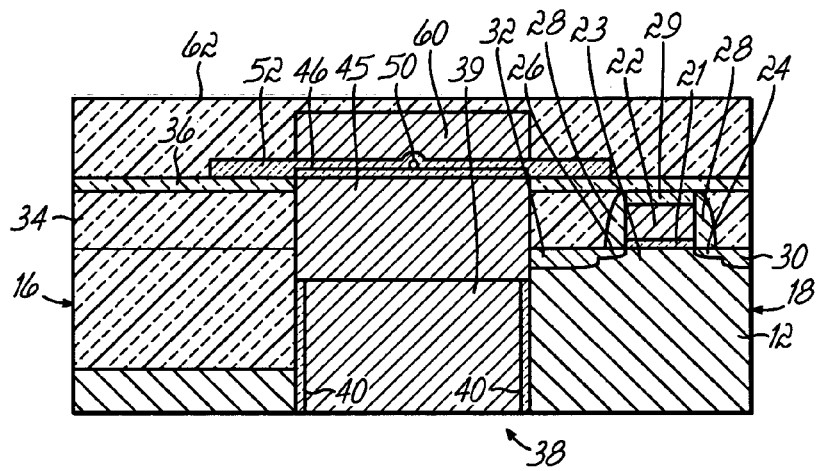
Figure 13C:
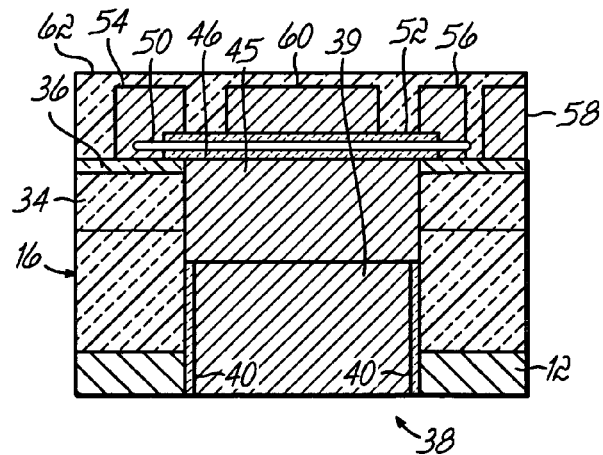

With reference to FIGS. 13A, 13B and 13C in which like features refer to like reference numerals in FIGS. 12A, 12B and 12C and at a subsequent fabrication stage, a layer 62 of an insulating material, such as SiO$_2$ or another dielectric, is deposited by, for example, CVD on the substrate 12 and polished flat by a CMP process or any other suitable planarization technique. The insulating layer 62 buries and electrically isolates the sense drain 54, the sense source 56, the bit line 58, and the read gate electrode 60.

Figure 14A:
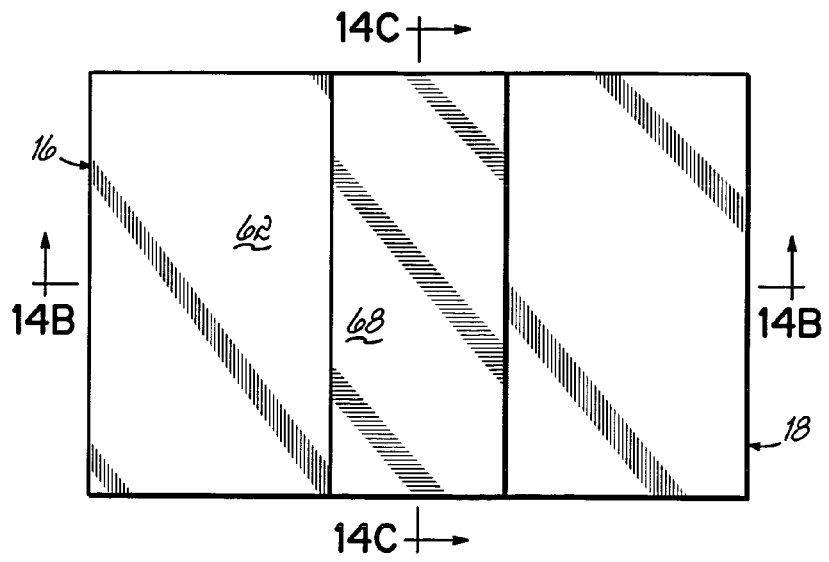
FIGS. 14A, 14B and 14C are views similar to FIGS. 13A, 13B and 13C, respectively, at a subsequent fabrication stage.
Figure 14B:
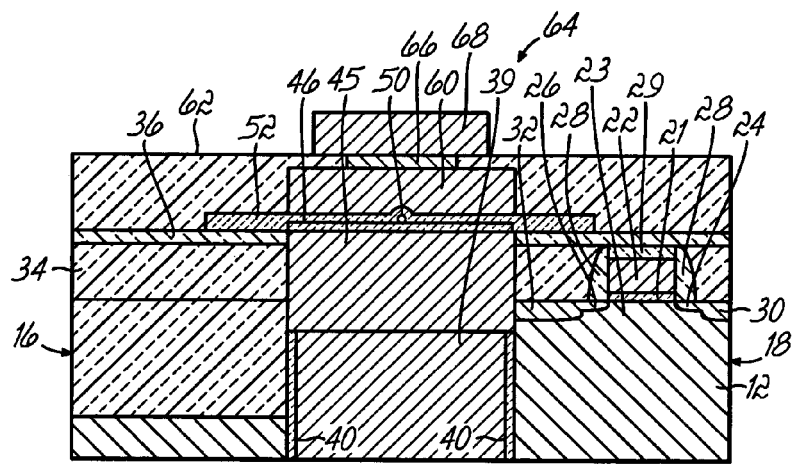
Figure 14C:
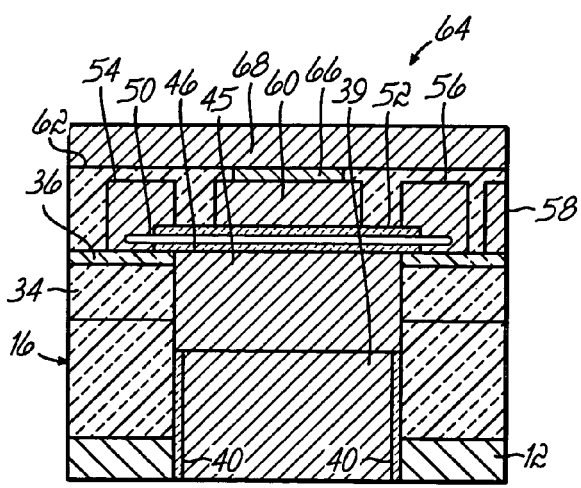

With reference to FIGS. 14A, 14B and 14C in which like features refer to like reference numerals in FIGS. 13A, 13B and 13C and at a subsequent fabrication stage, the fabrication of each memory gain cell 64 is completed by forming a read gate contact 66 from a deposited layer of an electrically conductive material, such as aluminum or tungsten, by a standard lithography and etch process at a location in each active region 18 overlying the corresponding gate electrode 60. A read bit line 68 is then formed by a standard lithography and etch process from a deposited layer of an electrically conductive material, such as aluminum or tungsten. The read bit line 68 is coupled electrically with the read gate contact 66 of each memory gain cell 64 in the completed memory array. The array of gain cells 64, each of which is fabricated on one of the active regions 18, is serviced by peripheral circuitry that individually addresses each memory gain cell 64.

Carbon nanotube(s) 50 supply a channel for the read device 61 of the memory gain cell 64 so that the read device 61 (FIG. 12) may be stacked directly above the storage capacitor 38, in contrast with conventional memory gain cells. The memory gain cell 64 therefore relies on a vertical device design that is more compact than conventional gain cells and, therefore, conserves the consumed space on the substrate 12 per memory gain cell 64.

In use, multiple gain cells 64 are electrically coupled with peripheral circuitry to define a memory circuit. The peripheral circuitry is used to individually address the write device 20 of specific gain cells 64 for charging the storage capacitor 38 of the addressed memory gain cell 64 to set one of two mutually-exclusive and self-maintaining binary operating states, zero (i.e., off) or one (i.e., on). To that end, the write device 20 operates by applying a voltage to the gate electrode 22 of the particular gain cell 64 selected with the write bit line 58 that varies the resistivity of channel 23 separating source and drain regions 30, 32. Carriers transferred from the source region 30 to the drain region, and subsequently between drain region 32 and the storage capacitor 38, electrically charges or electrically discharges the storage capacitor 38 to set the binary operating states. Thereafter, the storage capacitor 38 is electrically isolated from the write bit line 58 and the data bit is stored in the memory gain cell 64.

The peripheral circuitry addresses the read device 61 of specific gain cells 64 for sensing the binary operating state (i.e., stored charge or data bit) of the storage capacitor 38 of the addressed memory gain cell 64. The stored operating binary state is detected by the current flowing through the carbon nanotube(s) 50 between the sense source and drain 54, 56 when the read gate electrode 60 is powered by the peripheral circuitry to cause current flow in the underlying length of the carbon nanotube(s) 50. The storage capacitor 38 and the gate electrode 60 gate the carbon nanotube(s) 50 to permit current to flow between the sense source and drain 54, 56. The current flowing through the carbon nanotube(s) 50 is a function of the stored charge on the storage capacitor 38 and reflects the binary operating state of the addressed memory gain cell 64. More specifically, the current flowing through the carbon nanotube(s) 50 from the sense source 54 to the sense drain 56 is greater if the storage capacitor 38 is charged high (i.e., on) as opposed to being charged low (i.e., off).

The memory gain cell 64 of the invention differs from conventional gain cells due to the incorporation of the storage capacitor 38 as the gain cell storage device and features simplified access requirements. Stacking the storage capacitor 38 relative to the read device 61 permits higher cell densities than permitted in memory circuits formed from conventional gain cells. The memory gain cells 64 are double gated by the read gate electrode 60 and the storage capacitor 38 when read.

The fabrication of the memory gain cells 64 has been described by a specific order of fabrication stages and steps. However, it is understood that the order may differ from that described. For example, the order of two or more steps may be altered relative to the order shown. Also, two or more steps may be carried out concurrently or with partial concurrence. In addition, various steps may be omitted and other steps may be added. It is understood that all such variations are within the scope of the invention.

Figure 15:
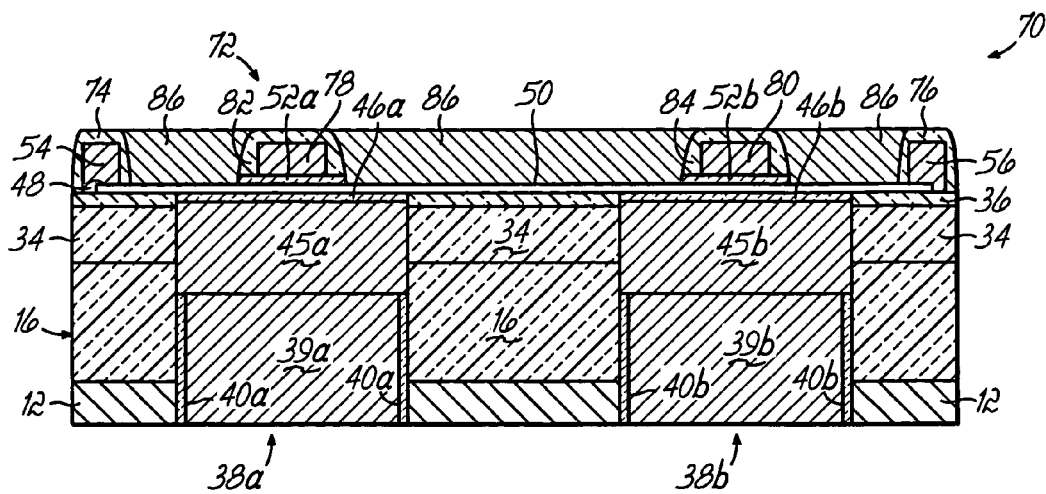
FIG. 15 is a diagrammatic cross-sectional view of an alternative embodiment of a memory gain cell of the invention.
Figure 16:
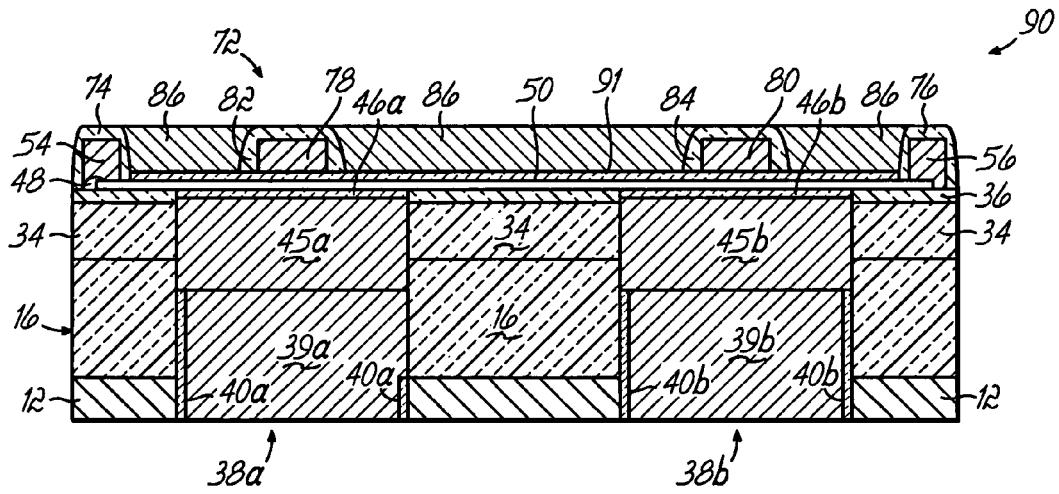
FIG. 16 is a diagrammatic cross-sectional view of an alternative embodiment of a memory gain cell of the invention.
Figure 17:
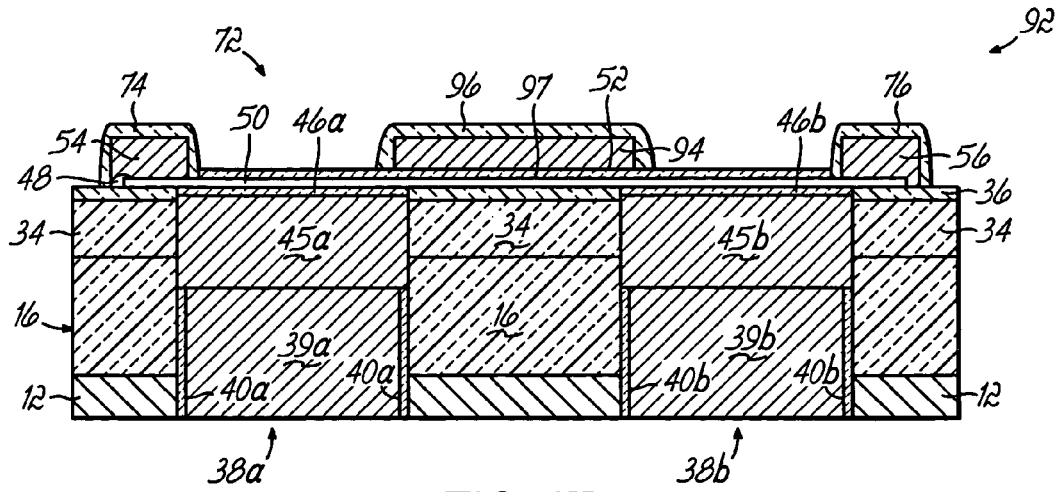
FIG. 17 is a diagrammatic cross-sectional view of an alternative embodiment of a memory gain cell of the invention.

Various alternative embodiments of the invention are presented in FIGS. 15–17 in which the memory gain cell have a single read device and a pair of storage capacitors, in contrast to the single storage capacitor embodiment described above. However, the invention in not so limited as the gain cells described below may incorporate more than two storage capacitors and a single read device. Additional storage capacitors are added at a location underlying the carbon nanotube(s) and the single read device.

With reference to FIG. 15 in which like features refer to like reference numerals in FIGS. 14A, 14B and 14C and in accordance with an alternative embodiment of the invention, a gain cell 70 includes a pair of storage capacitors 38a, 38b, each of which is structurally similar to storage capacitor 38 (FIGS. 8A–C). Components of storage capacitors 38a, 38b corresponding to components of storage capacitor 38 are labeled in FIG. 15 with similar reference numerals appended with "a" or "b", respectively. Storage capacitors 38a, 38b are constructed by a fabrication process identical to the fabrication process forming storage capacitor 38. Each of the storage capacitors 38a, 38b is coupled with a corresponding write device (not shown) similar to write device 20 (FIG.

3B), which is coupled to the write device of adjacent gain cells 70 by a write bit line (not visible in FIG. 15) similar to write bit line 58 (FIGS. 12A and 12C). The presence of two storage capacitors 38a, 38b permits the gain cell 70 to store more than one bit per gain cell. The storage capacitors 38a, 38b share a read device 72, as described below. Carbon nanotube 50, which is coupled between the sense drain 54 and the sense source 56, is oriented such that corresponding portions of its length overlie each of the storage capacitors 38a, 38b. The sense drain and source 54, 56 are each covered by a corresponding spacer 74, 76.

The read device 72 of gain cell 70 includes a pair of read gates 78, 80 composed of conductive material each covered by an electrically-insulating spacer 82, 84, respectively. The dielectric material of the gate dielectrics 52a, 52b associated with read gates 78, 80, respectively, coats and encapsulates the length of the carbon nanotube(s) 50 underlying each of the read gates 78, 80. Opposite ends of the carbon nanotube(s) 50 are not coated by gate dielectrics 52a, 52b for establishing contacts with the sense drain and sense source 54, 56, respectively, and a portion of length of the carbon nanotube(s) 50 between the two read gates 78, 80 is also uncoated by gate dielectrics 52a, 52b. The semiconducting carbon nanotube(s) 50 define a channel region coupled at opposite ends to the sense drain and source 54, 56, respectively. A conductive layer 86 defines a shunt that maintains portions or lengths of the carbon nanotube(s) 50 not underlying the read gates 78, 80 and spacers 82, 84 in a continuously conducting state characterized by reduced electrical resistance. The read gates 78, 80, spacers 82, 84 and conductive layer 86 are formed by processes familiar to persons of ordinary skill in the art. The width of the spacers 82, 84 may be adjusted for delineating the specific length of the carbon nanotube(s) 50 gated by the corresponding storage capacitors 38a, 38b.

The two "bits" of the gain cell 70 are coupled in series by the carbon nanotube(s) 50. Hence, the carbon nanotube(s) 50 conduct a threshold current in the off state as the read gates 78, 80 supply a threshold voltage. When one of the storage capacitors 38a or 38b has been set by the corresponding write device to provide a binary one and the corresponding read gate 78, 80 is supplied with a read voltage, the underlying length of carbon nanotube(s) 50 is rendered conducting, which increases the current flowing from the sense source 56 to the sense drain 54. The current is detected by peripheral circuitry of the memory circuit coupled with the sense drain 54. To distinguish the specific storage capacitors 38a, 38b, different read voltages are supplied to the read gates 78, 80, which results in a distinctive and identifiable current flow in the corresponding underlying portions of the carbon nanotube(s) 50. When a read voltage is supplied to both read gates 78, 80 and both storage capacitors 38a, 38b are charged high, the current flowing in the carbon nanotube(s) 50 is larger than when only one of the storage capacitors 38a, 38b is charged.

With reference to FIG. 16 in which like features refer to like reference numerals in FIG. 15 and in accordance with an alternative embodiment of the invention, the conductive layer 86 of a gain cell 90 is connected in series with the read gates 78, 80. Voltage is supplied to the conductive layer 86 only when data is to be read from gain cell 90. A gate dielectric 91 electrically isolates the read gates 78, 80 of the read device 72 and the conductive layer 86 from all portions or lengths of the carbon nanotube(s) 50, other than lengths near the opposite free ends of the carbon nanotube(s) 50 coupled respectively with the sense drain 54 and sense source 56. When the gain cell 90 is read, voltage is supplied simultaneously to the read gates 78, 80 and to the conductive layer 86, which are capacitively coupled with different lengths of the carbon nanotube(s) 50, for rendering those different lengths conducting. As above, the width of the spacers 82, 84 may be adjusted for delineating the specific portions or lengths of the carbon nanotube(s) gated by the corresponding storage capacitors 38a, 38b. Cell operation is similar to that described for gain cell 70 (FIG. 15) for various binary operating states of the storage capacitors 38a, 38b.

With reference to FIG. 17 in which like features refer to like reference numerals in FIG. 16 and in accordance with an alternative embodiment of the invention, a gain cell 92 includes a read gate 94 that gates an underlying region of the carbon nanotube(s) 50 flanked by the storage capacitors 38a, 38b. Read gate 94 is covered by an insulating spacer 96 and is isolated from the carbon nanotube(s) 50 by a gate dielectric 97. The read gate 94 does not overlie the majority of the portions of the carbon nanotube(s) 50 overlying either of the storage capacitors 38a, 38b but instead gates only the portion or length of the carbon nanotube(s) 50 overlying layer 34. The portion or length of the carbon nanotube(s) 50 overlying storage capacitor 38a has a resistance that is proportional to the charge held by the storage capacitor 38a. Similarly, the portion or length of the carbon nanotube(s) 50 overlying storage capacitor 38b has a resistance that is proportional to the charge held by the storage capacitor 38b. Therefore, when the carbon nanotube(s) 50 are gated by one or both of the storage capacitors 38a, 38b, the current flowing between the sense drain 54 and sense source 56 is increased as the electrical resistivity of the length or lengths of the carbon nanotube(s) 50 is reduced. The sense drain 54, the sense source 56 and the read gate 94 may be self-aligned to the storage capacitors 38a, 38b as understood by persons of ordinary skill in the art. When voltage is applied by the peripheral circuitry of the memory circuit to the read gate 94, the underlying segment or portion carbon nanotube(s) 50 becomes conducting so that an increased current flows from the sense drain and source 54, 56. The detected current is proportional to the charge state of each of the storage capacitors 38a, 38b, which permits the peripheral circuitry to distinguish when none, one, or both of the storage capacitors 38a, 38b are charged high. The charge stored by each of the storage capacitors 38a, 38b, which determines the capacitor voltage, must differ so that the storage capacitors 38a, 38b may be distinguished when gain cell 92 is read.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A memory gain cell comprising:
  a first storage capacitor capable of holding a stored electrical charge; and
  a read device including a source, a drain, a read gate, and at least one semiconducting carbon nanotube with a first end electrically coupled with said source, a second end electrically coupled with said drain, and a first portion located between said first and second ends, said first portion being gated by said read gate and said first storage capacitor to thereby regulate a current flowing through said at least one semiconducting carbon nanotube from said source to said drain, said current flowing through said at least one semiconducting carbon nanotube, when said first portion is gated, being dependent upon said electrical charge stored by said first storage capacitor.

2. The memory gain cell of claim 1 further comprising:
a write device electrically coupled with said first storage capacitor and adapted to charge and discharge said first storage capacitor to define said stored electrical charge.

3. The memory gain cell of claim 2 wherein said write device comprises a MOSFET.

4. The memory gain cell of claim 1 wherein said first portion is positioned between said first storage capacitor and said read gate.

5. The memory gain cell of claim 1 wherein said at least one semiconducting carbon nanotube includes a second portion that overlies said first storage capacitor.

6. The memory gain cell of claim 1 further comprising:
a second storage capacitor capable of holding a stored electrical charge, said electrical charge stored by said second storage capacitor affecting said current being flowing through said at least one semiconducting carbon nanotube when said first portion is gated by said read device.

7. The memory gain cell of claim 6 wherein said at least one semiconducting carbon nanotube includes a second portion overlying said second storage capacitor and said first portion does not overlie said second storage capacitor.

8. The memory gain cell of claim 6 further comprising:
a write device electrically coupled with said second storage capacitor and adapted to charge and discharge said second storage capacitor to define said stored electrical charge.

9. The memory gain cell of claim 8 wherein said write device comprises a MOSFET.

10. The memory gain cell of claim 1 further comprising:
a shunt of a conductive material adapted to gate said at least one semiconducting carbon nanotube between said first and second ends over at least one second portion not coinciding with said first portion.

11. The memory gain cell of claim 10 wherein said shunt is isolated electrically from said at least one second portion so that said at least one second portion is gated by said shunt only when said first portion is gated by said read gate.

12. The memory gain cell of claim 10 wherein said shunt is electrically coupled with said at least one second portion so that said at least one second portion is continuously gated.

13. A memory circuit comprising an interconnected plurality of memory gain cells of claim 1 arranged in a memory cell array.

14. A memory gain cell comprising:
a storage capacitor;
a write device electrically coupled with said storage capacitor and adapted to charge and discharge said storage capacitor to define a stored electrical charge; and
a read device including a source, a drain, a read gate overlying said storage capacitor, and at least one semiconducting carbon nanotube with a first end electrically coupled with said source, a second end electrically coupled with said drain, and a portion between said first end and said second end, said portion being disposed between said storage capacitor and said read gate such that said portion is gated by said read gate and said storage capacitor to thereby regulate a current flowing through said at least one semiconducting carbon nanotube from said source to said drain, said current being dependent upon said stored electrical charge of said storage capacitor.

15. The memory gain cell of claim 14 wherein said read gate changes a resistivity of said portion of said at least one semiconducting carbon nanotube when voltage is supplied to said read gate effective to gate said portion.

16. The memory gain cell of claim 14 wherein said stored electrical charge stored by said storage capacitor changes a resistivity of said portion of said at least one semiconducting carbon nanotube.

17. The memory gain cell of claim 14 wherein said write device comprises a MOSFET.

18. The memory gain cell of claim 17 wherein said MOSFET comprises:
a drain electrically coupled with said storage capacitor;
a source;
a channel region flanked by said source and said drain of said MOSFET; and
a gate electrode electrically isolated from said channel region, said gate electrode operative for controlling a resistivity of said channel region for charging and discharging said stored charge of said storage capacitor by transferring carriers from said source of said MOSFET to said drain of said MOSFET.

19. A memory circuit comprising an interconnected plurality of memory gain cells of claim 14 arranged in a memory cell array.

20. A memory gain cell comprising:
first and second storage capacitors;
first and second write devices each electrically coupled with one of said first and second storage capacitors and each adapted to individually charge and discharge a corresponding one of said first and second storage capacitors to define a corresponding stored electrical charge; and
a read device including a source, a drain, a read gate, and at least one semiconducting carbon nanotube with a first end electrically coupled with said source, a second end electrically coupled with said drain, and a first portion between said first end and said second end, said first portion being gated by said read gate and said first and second storage capacitors to thereby regulate a current flowing through said at least one semiconducting carbon nanotube from said source to said drain, said current being dependent upon said stored electrical charge held by each of said first and second storage capacitors.

21. The memory gain cell of claim 20 wherein said at least one semiconducting carbon nanotube includes a second portion between said first end and said first portion and a third portion between said second end and said first portion, said second portion overlying said first storage capacitor and said third portion overlying said second storage capacitor.

22. The memory gain cell of claim 21 wherein said read gate changes a resistivity of said first portion of said at least one semiconducting carbon nanotube when voltage is supplied to said read gate effective to gate said first portion.

23. The memory gain cell of claim 21 wherein said stored electrical charge of said first storage capacitor changes a resistivity of said second portion of said at least one semiconducting carbon nanotube.

24. The memory gain cell of claim 21 wherein said stored electrical charge of said second storage capacitor changes a resistivity of said third portion of said at least one semiconducting carbon nanotube.

25. The memory gain cell of claim 20 wherein said first and second storage capacitors are separated by an isolation region, and said first portion of said at least one semiconducting carbon nanotube is disposed between said isolation region and said read gate.

26. The memory gain cell of claim 20 wherein said current flowing through said at least one semiconducting carbon nanotube when gated by said read device is contingent upon said stored electrical charge of each of said first and second storage capacitors.

27. The memory gain cell of claim 20 wherein each of said first and second write devices comprises a MOSFET.

28. The memory gain cell of claim 27 wherein said MOSFET comprises:
   a drain electrically coupled with said storage capacitor;
   a source;
   a channel region flanked by said source and said drain of said MOSFET; and
   a gate electrode electrically isolated from said channel region, said gate electrode operative for controlling a resistivity of said channel region for charging and discharging said stored charge of a corresponding one of said first and second storage capacitors by transferring carriers from said source of said MOSFET to said drain of said MOSFET.

29. A memory circuit comprising an interconnected plurality of memory gain cells of claim 20 arranged in a memory cell array.

30. A memory gain cell comprising:
   first and second storage capacitors;
   first and second write devices each electrically coupled with one of said first and second storage capacitors and each adapted to individually charge and discharge a corresponding one of said first and second storage capacitors to define a corresponding stored electrical charge;
   a read device including a source, a drain, first and second read gates, and at least one semiconducting carbon nanotube with a first end electrically coupled with said source, a second end electrically coupled with said drain, and first and second portions between said first end and said second end, said first portion being gated by said first read gate and said first storage capacitor and said second portion being gated by said second read gate and said second storage capacitor to thereby regulate a current flowing through said at least one semiconducting carbon nanotube from said source to said drain, said current being dependent upon said stored electrical charge held by each of said first and second storage capacitors; and
   a shunt of a conductive material adapted to gate said at least one semiconducting carbon nanotube between said first and second ends over at least one third portion not coinciding with said first and second portions.

31. The memory gain cell of claim 30 wherein said shunt is configured to gate said at least one third portion by changing a resistivity of said at least one third portion only when said first and second portions are gated by said first and second read gates.

32. The memory gain cell of claim 30 wherein said shunt is configured to continuously gate said at least one third portion by changing a resistivity of said at least one third portion.

33. The memory gain cell of claim 30 wherein said first read gate changes a resistivity of said first portion of said at least one semiconducting carbon nanotube when voltage is supplied to said first read gate effective to gate said first portion.

34. The memory gain cell of claim 30 wherein said second read gate changes a resistivity of said second portion of said at least one semiconducting carbon nanotube when voltage is supplied to said second read gate effective to gate said second portion.

35. The memory gain cell of claim 30 wherein said stored electrical charge of said first storage capacitor changes a resistivity of said first portion of said at least one semiconducting carbon nanotube.

36. The memory gain cell of claim 30 wherein said stored electrical charge of said second storage capacitor changes a resistivity of said second portion of said at least one semiconducting carbon nanotube.

37. The memory gain cell of claim 30 wherein said current flowing through said at least one semiconducting carbon nanotube when gated by said first and second read gates is contingent upon said stored electrical charge of each of said first and second storage capacitors.

38. The memory gain cell of claim 30 wherein each of said first and second write devices comprises a MOSFET.

39. The memory gain cell of claim 38 wherein said MOSFET comprises:
   a drain electrically coupled with said storage capacitor;
   a source;
   a channel region flanked by said source and said drain of said MOSFET; and
   a gate electrode electrically isolated from said channel region, said gate electrode operative for controlling a resistivity of said channel region for charging and discharging said stored charge of a corresponding one of said first and second storage capacitors by transferring carriers from said source of said MOSFET to said drain of said MOSFET.

40. The memory gain cell of claim 30 wherein said first read device is vertically stacked over said first storage capacitor.

41. The memory gain cell of claim 30 wherein said second read device is vertically stacked over said second storage capacitor.

42. A memory circuit comprising an interconnected plurality of memory gain cells of claim 30 arranged in a memory cell array.

* * * * *